（12）United States Patent
Cho et al.

(10) Patent No.: US 8,638,614 B2
(45) Date of Patent: Jan. 28, 2014

(54) NON-VOLATILE MEMORY DEVICE AND MOSFET USING GRAPHENE GATE ELECTRODE

(75) Inventors: Byung Jin Cho, Daejeon (KR); Jong Kyung Park, Daejeon (KR)

(73) Assignee: Korea Advanced Institute of Science and Technology (KR)

( * ) Notice: Subject to any disclaimer, the term of this patent is extended or adjusted under 35 U.S.C. 154(b) by 99 days.

(21) Appl. No.: 13/342,282

(22) Filed: Jan. 3, 2012

(65) Prior Publication Data
US 2012/0281484 A1 Nov. 8, 2012

(30) Foreign Application Priority Data
May 4, 2011 (KR) .................. 10-2011-0042508

(51) Int. Cl.
G11C 16/04 (2006.01)
(52) U.S. Cl.
USPC ............... 365/185.28; 365/185.29; 365/63; 365/51

(58) Field of Classification Search
USPC ............. 365/185.28–185.29, 185.18, 63, 51; 257/324–326, E29.255, 316, 319
See application file for complete search history.

(56) References Cited

U.S. PATENT DOCUMENTS

| | | | | |
|---|---|---|---|---|
| 7,312,491 B2 * | 12/2007 | Ufert et al. | ..................... | 257/296 |
| 7,732,853 B2 * | 6/2010 | Kim | ............................... | 257/315 |
| 7,858,989 B2 * | 12/2010 | Chen et al. | ....................... | 257/76 |
| 8,076,713 B2 * | 12/2011 | Lee et al. | ....................... | 257/321 |
| 8,350,342 B2 * | 1/2013 | Noda | .............................. | 257/408 |
| 8,409,957 B2 * | 4/2013 | Chang et al. | .................. | 438/287 |

* cited by examiner

Primary Examiner — David Lam
(74) Attorney, Agent, or Firm — Park & Associates IP Law, P.C.

(57) ABSTRACT

Disclosed herein is a method of remarkably improving the memory characteristics of a non-volatile memory device and the device reliability of the MOSFET using graphene which is a novel material that has a high work function and does not cause the deterioration of a lower insulating film.

18 Claims, 5 Drawing Sheets

NON-VOLATILE MEMORY DEVICE AND MOSFET USING GRAPHENE GATE ELECTRODE

REFERENCE TO RELATED APPLICATIONS

This application claims the priority benefit of Korean Application No. 10-2011-0042508 filed on May 4, 2011, the entire contents of which are incorporated herein by reference.

FIELD OF THE INVENTION

The present invention relates to a non-volatile memory device and MOSFET (Metal-Oxide-Semiconductor Field Effect Transistor), and, more particularly, to a method of remarkably improving the reliability of the MOSFET and the memory characteristics of a non-volatile memory device using graphene which is a novel material that has a high work function and does not cause the deterioration of a lower insulating film.

BACKGROUND OF THE INVENTION

Memory devices are classified into volatile memory devices and non-volatile memory devices depending on whether data is retained at the time of power off. Volatile memory devices are memory devices whose data disappears at the time of power off, and include DRAM and SRAM. Non-volatile memory devices are memory devices whose data is retained even at the time of power off, and include flash memory devices.

Hereinafter, the structure and operation of a conventional non-volatile memory device will be described with reference to FIG. 1. FIG. 1 is a sectional view of a conventional non-volatile memory device.

As shown in FIG. 1, a conventional non-volatile memory device comprises: a substrate 10; and a gate pattern including a tunnel oxide 11, a charge trap layer 12, a blocking oxide 13 and a gate electrode 14 sequentially formed on the substrate 10. Further, the conventional non-volatile memory device includes source/drain (S/D) regions formed at both corners of the substrate 10.

The tunnel oxide 11 is provided as an energy barrier film depending on the tunneling of charges (electrons), and is generally formed of an oxide film. The charge trap layer 12 is actually used as a data storage medium. The charge trap layer 12 stores data by trapping charges into a deep level trap site, and is generally formed of a nitride film. The blocking oxide 13 serves to prevent charges from moving to the gate electrode 14, and is generally formed of an $Al_2O_3$ film.

According to the above-mentioned conventional non-volatile memory device, during program operation, charges are tunneled into the charge trap layer 12 by F-N tunneling (Fowler-Nordheim tunneling) and become trapped therein, thus storing data. Further, at the time of erasing data, charges are tunneled from the charge trap layer 12 by F-N tunneling (Fowler-Nordheim tunneling) to be discharged to a channel or holes are injected into the charge trap layer 12, thus erasing data.

However, recently, with improvements in the extent of integration of memory devices, the cell area thereof has been reduced, thus causing a problem of deterioration in the operating speed and data retention characteristics of the memory device. In particular, when the blocking oxide 13 and the gate electrode 14 are formed of an $Al_2O_3$ film and a TaN electrode (or polycrystalline silicon electrode), respectively, it is known that many defects occur in an adjacent area of the $Al_2O_3$ film and the TaN electrode facing each other, thus further deteriorating the operating speed and data retention characteristics of the memory device. More particularly, in the case of a TaN electrode having a mid-gap work function, an erase saturation phenomenon occurs early, so there is a problem in that a memory window cannot be greatly improved. Therefore, conventionally, in order to improve the operating speed and memory window of a memory device, methods of applying metal gates having a high work function to a memory device have been proposed. However, since most of the metal gates are made of a precious metal such as gold, silver, platinum or the like, there is a problem in that they are not compatible with a CMOS technology and cannot be easily etched.

SUMMARY OF THE INVENTION

Accordingly, the present invention has been devised to solve the above-mentioned problems, and an object of the present invention is to provide a non-volatile memory device which can remarkably improve memory characteristics using graphene as a gate electrode, the graphene being a novel material that has a high work function and does not cause the deterioration of a lower insulation film.

The another object of the present invention is to provide a MOSFET which can remarkably improve device reliability using graphene as a gate electrode.

In order to accomplish the above object, an aspect of the present invention provides a non-volatile memory device, including: a tunnel oxide for tunneling charges, a data storage layer, a blocking oxide, a gate electrode made of graphene and a metal electrode for capping, which are sequentially formed on a channel region between the source/drain electrodes of a substrate.

Here, the gate electrode made of graphene may serve to lower a tunneling current injected into the data storage layer from the gate electrode during an erasing operation, and may serve to prevent charges injected into the data storage layer from being discharged to the gate electrode to improve data retention characteristics of the non-volatile memory device during program operation.

The gate electrode may be made of P-type doped graphene, and may be formed to a thickness of 1-10 nm.

The metal electrode may be disposed over the entire region of the gate electrode or over a part of the center region of the gate electrode, and may be formed to a thickness of 3-200 nm. The metal electrode may be made of aluminum (Al), nickel (Ni), platinum (Pt), gold (Au), copper (Cu), chromium (Cr), ruthenium (Ru), cobalt (Co), lead (Pd), silicon (Si), tungsten (W) or a combination thereof.

The blocking oxide may be formed of a $SiO_2$ film, an $Al_2O_3$ film or a combination thereof, and may be formed to a thickness of 6-15 nm.

The data storage layer may be a charge trap layer which traps charges into a deep level trap site and is formed of a $Si_3N_4$ film, or may be a charge storage layer which stores charges in a conduction band and is formed of a polysilicon film. The data storage layer may be formed to a thickness of 1-10 nm.

The tunnel oxide may be formed of a $SiO_2$ film, and may formed to a thickness of 1-10 nm.

The aspect of the present invention provides a Metal-Oxide-Semiconductor Field Effect Transistor (MOSFET), comprising: a gate oxide, a gate electrode made of graphene and a metal electrode for capping, which are sequentially formed on a channel region between the source/drain electrodes of a substrate. The gate oxide may be made of $SiO_2$ layer, SiON layer, $Al_2O_3$ layer, $HfO_2$ layer, HfON layer, HfSiON layer, HfLaON layer, $ZrO_2$ layer, ZrON layer, ZrSiON layer, ZrLaON layer, $La_2O_3$ layer, $Gd_2O_3$ layer or a combination thereof. The gate oxide may be formed to a thickness of 1-20 nm.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Hereinafter, preferred embodiments of the present invention will be described in detail with reference to the attached drawings.

Figure 1:
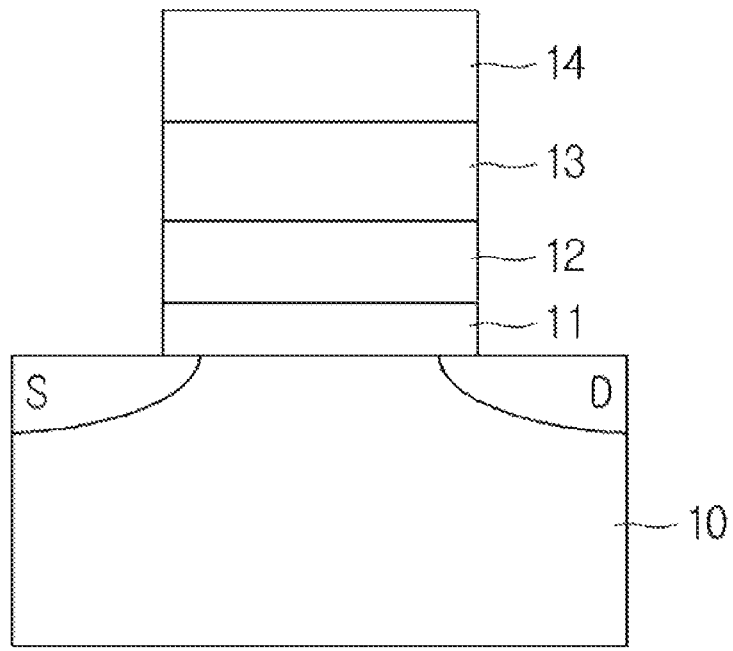
FIG. 1 is a sectional view of a conventional non-volatile memory device.
Figure 2A:
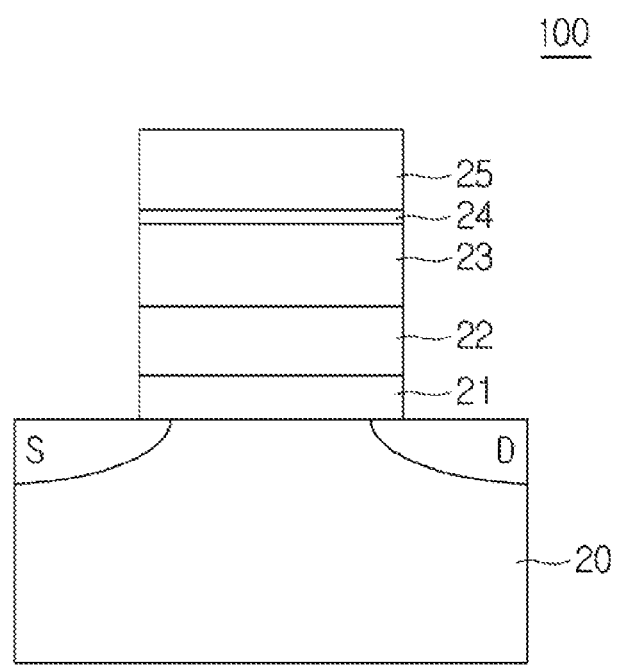
FIG. 2A is a sectional view of a non-volatile memory device according to an embodiment of the present invention.

FIG. 2A is a sectional view of a non-volatile memory device 100 according to an embodiment of the present invention.

Referring to FIG. 2A, the non-volatile memory device 100 according to an embodiment of the present invention includes: a substrate 20 (a semiconductor substrate such as a silicon substrate or the like) including source/drain (S/D) electrodes at both corners thereof; and a tunnel oxide 21, a charge trap layer or a charge storage layer 22, a blocking oxide 23, a gate electrode 24 and a metal electrode 25, which are sequentially formed on a channel region between the source/drain (S/D) electrodes of the substrate 20.

The tunnel oxide 21 is provided as an energy barrier film depending on the tunneling (F-N tunneling) of charges (electrons), and may be formed of a $SiO_2$ film. Here, the tunnel insulation film 21 may be formed to a thickness of 1-10 nm (for example, 4.5 nm).

The charge trap layer or charge storage layer 22 is actually used as a data storage medium, and is disposed between the tunnel oxide 21 and the blocking oxide 23. The charge trap layer 22 stores data by trapping charges into a deep level trap site, may be formed of a $Si_3N_4$ film, and may be formed to a thickness of 1-10 nm (for example, 6 nm). The charge storage film 22 stores data by storing charges in a conduction band, and may be formed of a polysilicon film.

The blocking oxide 23 serves to prevent the charges trapped or stored in the charge trap layer or charge storage layer 22 from moving to the gate electrode 24, may be formed of a $SiO_2$ film, an $Al_2O_3$ film or a combination thereof (for example, a $SiO_2/Al_2O_3$ film, a $SiO_2/Al_2O_3/SiO_2$ film, an $Al_2O_3/SiO_2/Al_2O_3$ film, or the like), and may be formed to a thickness of 6-15 nm.

The gate electrode 24 serves to trap or store the electrons derived from the channel region (region between the source/drain (S/D) electrodes of the substrate 20) into the charge trap layer or charge storage layer 22 when a positive voltage higher than that of the substrate 20 is applied to the gate electrode 24 (at the time of executing program), and serves to discharge the electrons stored in the charge trap layer or charge storage layer 22 to the channel region when a negative voltage higher than that of the substrate 20 is applied to the gate electrode 24 (at the time of erasing data). The gate electrode 24 may be formed of P-type doped graphene. The gate electrode 24 may be formed to a thickness of 1-10 nm (for example, 5 nm), and may include a plurality of graphene layers whose P-type impurity concentrations are different from each other.

Graphene, which is a carbon atomic monolayer, is a two-dimensional thin film having a hexagonal plane caused by a $sp^2$ hybrid orbital. It is known that graphene has a very high electron mobility of 100000 $cm^2/V \cdot s$ or more because electrons move in the graphene as if they do not have an effective mass. Further, graphene is advantageous in that it can be produced using a currently-used CMOS technology because it has a two-dimensional shape unlike carbon nanotubes of a round columnar shape.

The metal electrode 25, which is a capping electrode of the gate electrode made of graphene, serves to lower contact resistance and to apply stable voltage signals to the gate electrode 24. The metal electrode 25 may be made of aluminum (Al), nickel (Ni), platinum (Pt), gold (Au), copper (Cu), chromium (Cr), ruthenium (Ru), cobalt (Co), lead (Pd), silicon (Si), tungsten (W) or a combination thereof, and may be formed to a thickness of 3-200 nm. The metal electrode 25 may be disposed over the entire region of the gate electrode 24, but, if necessary, may be disposed over only a part (for example, ½, ⅓, ¼ of the entire region thereof) of the region of the metal gate electrode 24.

Figure 2B:
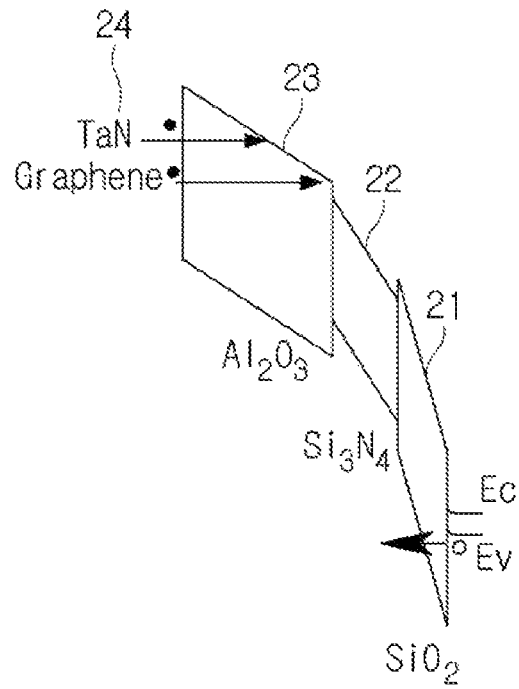
FIG. 2B is an energy band diagram of a non-volatile memory device during an erasing operation according to an embodiment of the present invention.

FIG. 2B shows an energy band diagram of a non-volatile memory device 100, particularly, a non-volatile memory device 100 including p-type doped graphene during an erasing operation according to an embodiment of the present invention. The P-type doped graphene has a very high work function of 5.2 eV or more. Therefore, when the gate electrode includes this p-type doped graphene, the erasing operation can be efficiently performed by lowering the tunneling current injected into the blocking oxide 23 from the gate electrode 24 (refer to solid arrows). Further, in this case, even when erasing voltage lower than that of a convention TaN electrode is used, the erasing operation can be efficiently performed without causing an erase saturation phenomenon.

Figure 2C:
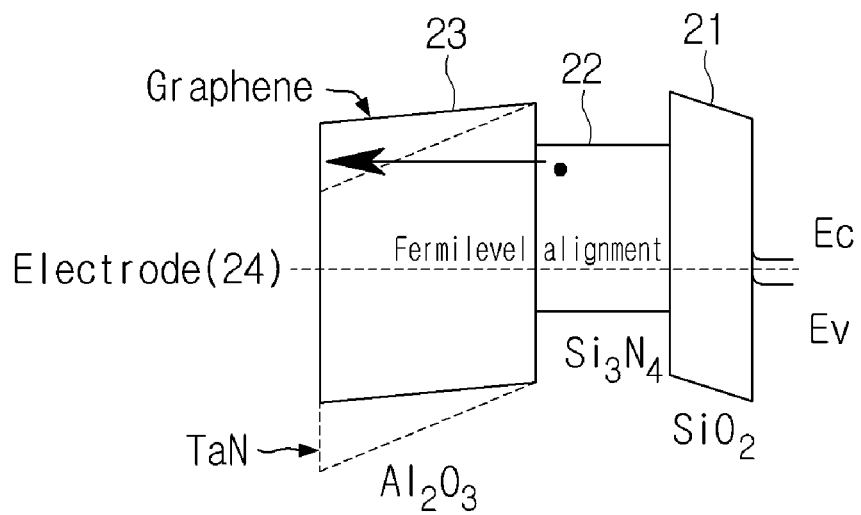
FIG. 2C is an energy band diagram of the charge retention state of a non-volatile memory device after program operation according to an embodiment of the present invention.

FIG. 2C shows an energy band diagram of the charge retention state of a non-volatile memory device 100, particularly, a non-volatile memory device 100 including a gate electrode 24 made of graphene having a high work function after program operation according to an embodiment of the present invention. When the gate electrode 24 made of graphene having a high work function is used, the energy level of the blocking oxide 23 adjacent to the gate electrode 24 becomes high. Therefore, the electric field strength in the blocking oxide 23 becomes low, and the tunneling distance, over which the electrons trapped or stored in the charge trap layer or charge storage layer 22 are discharged through the blocking oxide 23, becomes long, so that it is possible to efficiently prevent the charges injected into the charge storage layer 22 from being discharged to the gate electrode 24, thereby improving the data retention characteristics of a memory device. Further, in the case of the gate electrode 24 made of graphene, compared to a general metal (TaN) gate electrode, the number of defects formed in the blocking oxide can be remarkably reduced, so that the amount of the trap-assisted tunneling current discharged through the defects can be lowered, thereby further improving the write operation speed and the data retention characteristics of a memory device.

Figure 3:
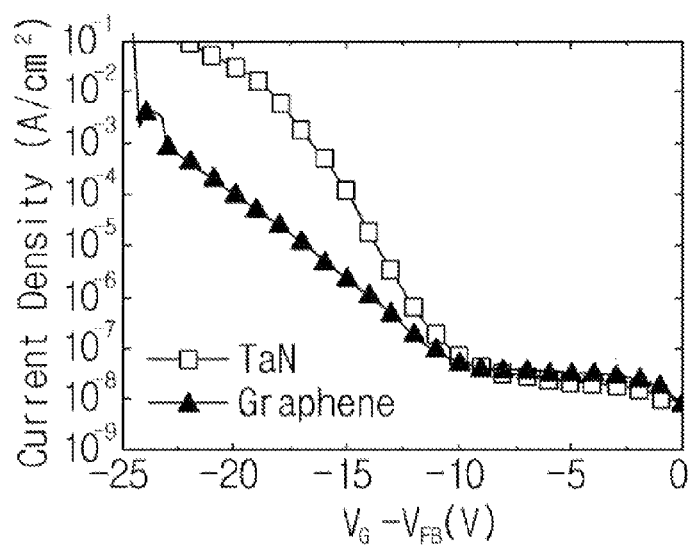
FIG. 3 is a graph showing the leakage current characteristics of a non-volatile memory device according to an embodiment of the present invention.

FIG. 3 is a graph showing the leakage current characteristics of a non-volatile memory device 100 according to an embodiment of the present invention. As shown in FIG. 3, it can be seen that the leakage current of the non-volatile memory device 100 including the gate electrode made of graphene is 1/102-1/103 lower than that of a conventional non-volatile memory device including a TaN gate electrode in an operation voltage range (−16V−−22V), and that the breakdown voltage of the non-volatile memory device 100 is also increased compared to that of the conventional non-volatile memory device.

Figure 4:
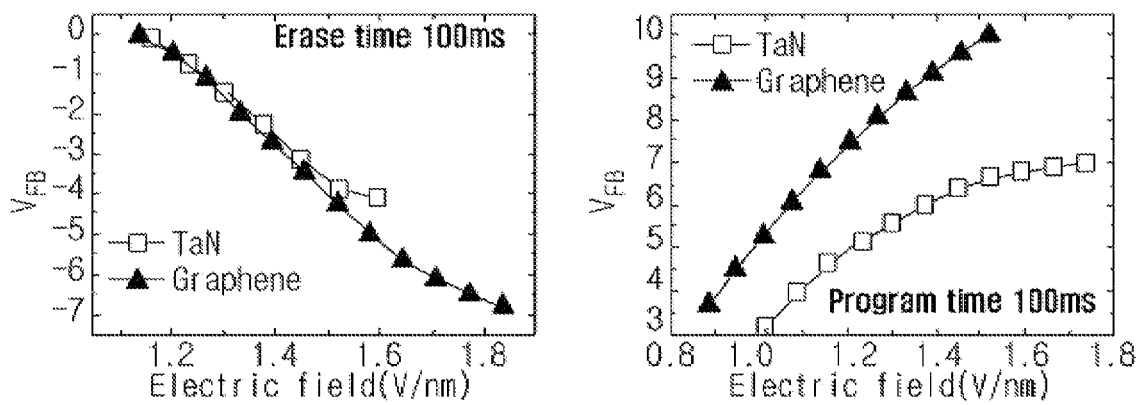
FIG. 4 shows graphs showing the operational characteristics of a non-volatile memory device according to an embodiment of the present invention.

FIG. 4 shows graphs showing the $V_{FB}$ (flat band voltage) operational characteristics of a non-volatile memory device 100 according to an embodiment of the present invention. Left and right graphs show program and eras characteristics, respectively. From the graphs of FIG. 4, it can be ascertained that, when the gate electrode 24 made of graphene is formed, the program speed and eras speed of a memory device are made faster compared to when a conventional gate electrode made of TaN is used. Further, from the graphs of FIG. 4, it can be ascertained that, when a conventional gate electrode made of TaN is used, data is not erased at a high erasing voltage, but when the gate electrode 24 made of graphene is formed, improved memory window characteristics are exhibited without causing an erase saturation phenomenon.

Figure 5:
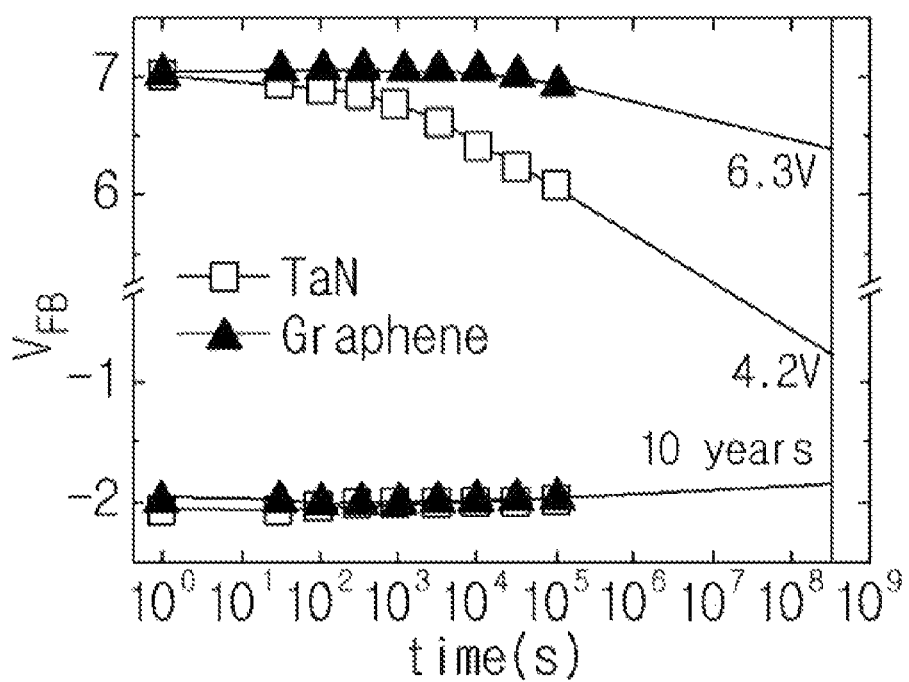
FIG. 5 is a graph showing the data retention characteristics of a non-volatile memory device according to an embodiment of the present invention.

FIG. 5 is a graph showing the data retention characteristics of a non-volatile memory device 100 according to an embodiment of the present invention. From the graph of FIG. 5, it can be ascertained that, when the gate electrode 24 made of graphene is formed, high $V_{FB}$ is maintained for a long period of time, and the data retention characteristics of the non-volatile memory device 100 are greatly improved, compared to when a conventional gate electrode made of TaN is used.

The present invention can be applied to a floating gate-type nonvolatile memory device using a floating gate electrode as a data (charge) storage medium as well as a charge trap-type non-volatile memory device including a charge trap layer as a data storage medium.

As described above, according to the non-volatile memory device of the present invention, a gate electrode is formed of graphene, thus improving the operating speed, memory window and data capacity thereof.

Also, above mentioned the graphene may be applicable to a gate electrode of Metal-Oxide-Semiconductor Field Effect Transistor (MOSFET). For example, a MOSFET may include a gate oxide, a gate electrode made of graphene and a metal electrode for capping, which may be sequentially formed on a channel region between the source/drain electrodes of a substrate.

The structure of the MOSFET according to another embodiment of the present invention may be similar to the structure with the exemption of data storage layer 22, a blocking oxide 23, and a gate electrode 24 in the non-volatile memory device 100 of FIG. 2A.

The gate oxide, the gate electrode and the metal electrode for capping of the MOSFET may be similarly formed into the tunnel oxide 21, a gate electrode 24 and a metal electrode 25 respectively. Also, gate oxide may be made of $SiO_2$ layer, SiON layer, $Al_2O_3$ layer, $HfO_2$ layer, HfON layer, HfSiON layer, HfLaON layer, $ZrO_2$ layer, ZrON layer, ZrSiON layer, ZrLaON layer, $La_2O_3$ layer, $Gd_2O_3$ layer or a combination thereof. The gate oxide that is a insulation layer between the channel region and the gate electrode, may be formed to a thickness of 1-20 nm (for example, 10 nm).

The MOSFET according to another embodiment of the present invention may be utilized to a device that needs the high device reliability such as PBTI (Positive Bias Temperature Instability), SILC (Stress Induced Leakage Current), and TDDB (Time-Dependent Dielectric Breakdown) characteristics, by the properties of the graphene that has a high work function and does not cause the deterioration of a lower insulation film against voltage and temperature stress due to its excellent mechanical flexibility.

For example, the graphene layer is grown on a $Cu/SiO_2/Si$ substrate by an inductively coupled plasma enhanced chemical vapor deposition (ICP-CVD) process. During the synthesis of graphene, the substrate temperature was ramped up to 850° C. for 15 min in a vacuum ambient and $H_2$ plasma was then supplied to the process chamber for 2 minutes. After purging with Ar for 2 min, $C_2H_2+H_2$ plasma was supplied to the chamber for 3 min; this is the main step of graphene growth. The gas flow ratio of $C_2H_2$:Ar was 1:40, and the pressure was 70 mTorr. Subsequently, the wafer was cooled down in a vacuum ambient.

For the graphene transfer on an arbitrary substrate, PMMA (Poly-methyl-metha-crylate) is coated on graphene/$Cu/SiO_2/$ Si. After the Cu layer was etched away in an aqueous solution of 0.1 M iron chloride ($FeCl_3$), the graphene film with the PMMA support was transferred to the arbitrary substrate. The PMMA support was removed with acetone. High vacuum annealing was performed at a pressure of $1\times10^{-6}$ Torr for 30 min at 350° C. to remove residual PMMA. The graphene layer may be transferred to the substrate for the MOSFETF or the non-volatile memory device 100 like the above process.

Figure 6:
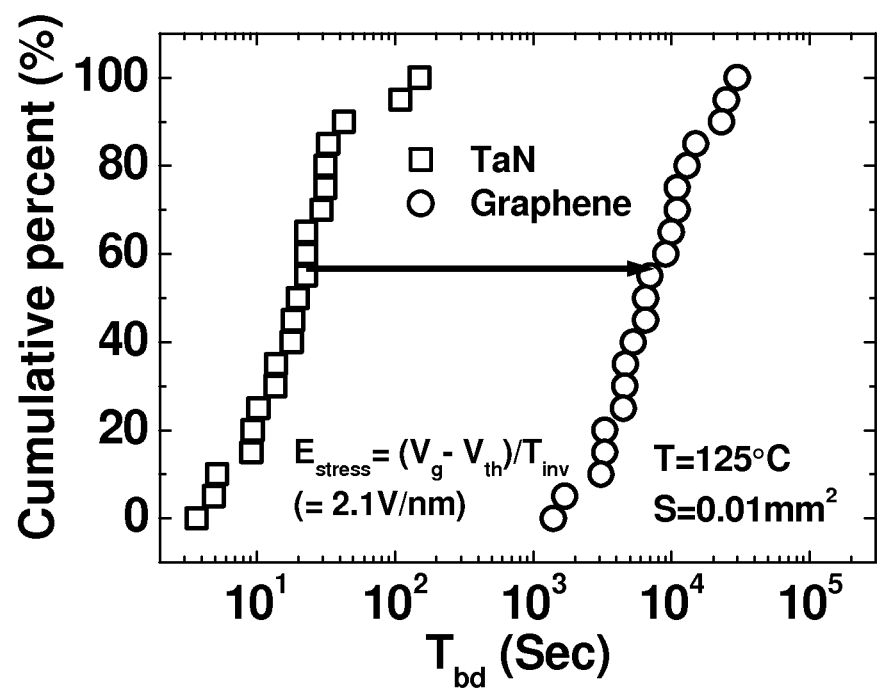
FIG. 6 is a graph showing the TDDB (Time-Dependent Dielectric Breakdown) characteristics of a MOSFET according to an embodiment of the present invention.

FIG. 6 shows graphs showing the TDDB characteristics of a MOSFET according to an embodiment of the present invention. From the graph showing the cumulative percent for distribution dielectric (gate oxide) breakdown times of MOSFET devices versus the voltage stress time ($T_{bd}$) in FIG. 6, it can be ascertained that, when the gate electrode made of graphene is formed, the device lifetime under the voltage stress is greatly improved compared to when a conventional gate electrode made of TaN is used.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A non-volatile memory device, comprising:
   a tunnel oxide for tunneling charges, a data storage layer, a blocking oxide, a gate electrode made of graphene and a metal electrode for capping, which are sequentially formed on a channel region between the source/drain electrodes of a substrate.

2. The non-volatile memory device according to claim 1, wherein the gate electrode made of graphene serves to lower a tunneling current injected into the data storage layer from the gate electrode during an erasing operation, and serves to prevent charges injected into the data storage layer from being discharged to the gate electrode to improve data retention characteristics of the non-volatile memory device during program operation.

3. The non-volatile memory device according to claim 1, wherein the gate electrode is made of P-type doped graphene.

4. The non-volatile memory device according to claim 1, wherein the gate electrode is formed to a thickness of 1-10 nm.

5. The non-volatile memory device according to claim 1, wherein the metal electrode is disposed over an entire region of the gate electrode.

6. The non-volatile memory device according to claim 1, wherein the metal electrode is disposed over a part of a center region of the gate electrode.

7. The non-volatile memory device according to claim 1, wherein the metal electrode is formed to a thickness of 3-200 nm.

8. The non-volatile memory device according to claim 1, wherein the metal electrode is made of aluminum (Al), nickel (Ni), platinum (Pt), gold (Au), copper (Cu), chromium (Cr), ruthenium (Ru), cobalt (Co), lead (Pd), silicon (Si), tungsten (W) or a combination thereof.

9. The non-volatile memory device according to claim 1, wherein the blocking oxide is formed of a $SiO_2$ film, an $Al_2O_3$ film or a combination thereof.

10. The non-volatile memory device according to claim 1, wherein the blocking oxide is formed to a thickness of 6-15 nm.

11. The non-volatile memory device according to claim 1, wherein the data storage layer is a charge trap layer which traps charges into a deep level trap site and is formed of a $Si_3N_4$ film.

12. The non-volatile memory device according to claim 1, wherein the data storage layer is a charge storage layer which stores charges in a conduction band and is formed of a polysilicon film.

13. The non-volatile memory device according to claim 1, wherein the data storage layer is formed to a thickness of 1-10 nm.

14. The non-volatile memory device according to claim 1, wherein the tunnel oxide is formed of a $SiO_2$ film.

15. The non-volatile memory device according to claim 1, wherein the tunnel oxide is formed to a thickness of 1-10 nm.

16. A Metal-Oxide-Semiconductor Field Effect Transistor (MOSFET), comprising:

a gate oxide, a gate electrode made of graphene and a metal electrode for capping, which are sequentially formed on a channel region between the source/drain electrodes of a substrate.

17. The MOSFET according to claim 16, wherein the gate oxide is made of $SiO_2$ layer, SiON layer, $Al_2O_3$ layer, $HfO_2$ layer, HfON layer, HfSiON layer, HfLaON layer, $ZrO_2$ layer, ZrON layer, ZrSiON layer, ZrLaON layer, $La_2O_3$ layer, $Gd_2O_3$ layer or a combination thereof.

18. The MOSFET according to claim 16, wherein the gate oxide is formed to a thickness of 1-20 nm.

* * * * *